United States Patent
Wu et al.

(10) Patent No.: US 12,426,381 B2
(45) Date of Patent: Sep. 23, 2025

(54) TANDEM PHOTOVOLTAIC DEVICE AND PRODUCTION METHOD

(71) Applicant: LONGI GREEN ENERGY TECHNOLOGY CO., LTD., Xi'an (CN)

(72) Inventors: Zhao Wu, Xi'an (CN); Chen Xu, Xi'an (CN); Zifeng Li, Xi'an (CN)

(73) Assignee: LONGI GREEN ENERGY TECHNOLOGY CO., LTD., Xi'an (CN)

( * ) Notice: Subject to any disclaimer, the term of this patent is extended or adjusted under 35 U.S.C. 154(b) by 370 days.

(21) Appl. No.: 17/799,746

(22) PCT Filed: Oct. 22, 2020

(86) PCT No.: PCT/CN2020/122770
§ 371 (c)(1),
(2) Date: Sep. 9, 2022

(87) PCT Pub. No.: WO2021/159728
PCT Pub. Date: Aug. 19, 2021

(65) Prior Publication Data
US 2023/0074348 A1 Mar. 9, 2023

(30) Foreign Application Priority Data
Feb. 13, 2020 (CN) .......................... 202010091544.9

(51) Int. Cl.
*H10F 10/161* (2025.01)
*H10F 77/122* (2025.01)
*H10F 77/1226* (2025.01)

(52) U.S. Cl.
CPC ....... *H10F 10/161* (2025.01); *H10F 77/1227* (2025.01)

(58) Field of Classification Search
CPC ........................... H10F 10/161; H10F 77/1227
See application file for complete search history.

(56) References Cited

U.S. PATENT DOCUMENTS

| | | | |
|---|---|---|---|
| 4,272,641 A | 6/1981 | Hanak | |
| 4,377,723 A | 3/1983 | Dalal | |

(Continued)

FOREIGN PATENT DOCUMENTS

| | | | |
|---|---|---|---|
| CN | 101814557 A | 8/2010 | |
| CN | 101960622 A | 1/2011 | |

(Continued)

*Primary Examiner* — Jayne L Mershon
(74) *Attorney, Agent, or Firm* — Bayramoglu Law Offices LLC

(57) ABSTRACT

A tandem photovoltaic device includes: an upper cell unit, a lower cell unit and a tunnel junction positioned between the upper cell unit and the lower cell unit; the tunnel junction includes an upper transport layer, a lower transport layer, and an intermediate layer positioned between the upper transport layer and the lower transport layer, the intermediate layer is an ordered defect layer, or, the intermediate layer is a continuous thin layer, or, the intermediate layer includes a first layer in contact with the lower transport layer and a second layer in contact with the upper transport layer; a doping concentration of the first layer is 10-10,000 times of a doping concentration of the lower transport layer, and the doping concentration of the first layer is less than $10^{21}$ $cm^{-3}$; a doping concentration of the second layer is 10-10,000 times of a doping concentration of the upper transport layer.

11 Claims, 1 Drawing Sheet

(56) References Cited

U.S. PATENT DOCUMENTS

| | | |
|---|---|---|
| 2010/0006136 A1 | 1/2010 | Zide |
| 2016/0111577 A1 | 4/2016 | Sato et al. |
| 2016/0181456 A1* | 6/2016 | Zhang .................. H10F 10/161 |
| | | 136/255 |
| 2020/0058819 A1* | 2/2020 | Kirner .................. H10F 10/161 |

FOREIGN PATENT DOCUMENTS

| | | |
|---|---|---|
| CN | 102790119 A | 11/2012 |
| CN | 103681935 A | 3/2014 |
| CN | 103715317 A | 4/2014 |
| CN | 104319295 A | 1/2015 |
| CN | 104779313 A | 7/2015 |
| CN | 110600614 A | 12/2019 |
| EP | 0153043 A2 | 8/1985 |
| WO | 2018150203 A1 | 8/2018 |
| WO | 2019050185 A1 | 3/2019 |

* cited by examiner

TANDEM PHOTOVOLTAIC DEVICE AND PRODUCTION METHOD

CROSS REFERENCE TO THE RELATED APPLICATIONS

This application is the national phase entry of International Application No. PCT/CN2020/122770, filed on Oct. 22, 2020, which is based upon and claims priority to Chinese Patent Application No. 202010091544.9, filed on Feb. 13, 2020, the entire contents of which are incorporated herein by reference.

TECHNICAL FIELD

The present disclosure relates to the technical field of solar-energy photovoltaics and more particularly, to a tandem photovoltaic device and a producing method thereof.

BACKGROUND

For a tandem photovoltaic device, sunlight may be divided into multiple wave bands. A tandem photovoltaic device can absorb sunlight with different energies by using solar cell units with gradually reduced band gaps from front to back, to widen the wave bands responding to the spectra of the sunlight, thereby reducing the energy loss. Therefore, tandem photovoltaic devices have an extensive prospect of application.

A tunnel junction has a strong recombination capacity, and a thickness required to achieve a higher recombination rate is small. Therefore, the tunnel junction is usually used in the tandem photovoltaic device to connect cell units in series.

However, an overall series resistance of the tandem photovoltaic device in the prior art is high.

SUMMARY

The present disclosure provides a tandem photovoltaic device and a producing method thereof, which aims at solving the problem that the overall series resistance of the tandem photovoltaic device is high.

According to the first aspect of the present disclosure, a tandem photovoltaic device is provided, wherein the tandem photovoltaic device includes: an upper cell unit, a lower cell unit and a tunnel junction located between the upper cell unit and the lower cell unit;

the lower cell unit is a crystalline silicon cell;

the tunnel junction includes an upper transport layer, a lower transport layer and an intermediate layer located between the upper transport layer and the lower transport layer, the upper transport layer and the lower transport layer are in direct contact with the intermediate layer, respectively, the upper transport layer corresponds to a first conducting type, and the lower transport layer corresponds to a second conducting type, wherein the first conducting type is different from the second conducting type;

the intermediate layer is an ordered defect layer, a space scale of defects of the ordered defect layer is 0.5-2 nm, and an average center distance of the defects is 1-100 nm; or the intermediate layer is a continuous thin layer, when a material of the intermediate layer is a metal, a thickness of the intermediate layer is 0.5-2 nm; and when a material of the intermediate layer is a semiconductor material, a doping concentration of the continuous thin layer is $10^{20}$-$10^{21}$ cm$^{-3}$; or the intermediate layer includes a first layer contacted with the lower transport layer and a second layer contacted with the upper transport layer, a conducting type of the first layer is the same as a conducting type of the lower transport layer, a conducting type of the second layer is the same as a conducting type of the upper transport layer, a doping concentration of the first layer is 10-10000 times of a doping concentration of the lower transport layer, and the doping concentration of the first layer is less than or equal to $10^{21}$ cm$^{-3}$; a doping concentration of the second layer is 10-10000 times of a doping concentration of the upper transport layer, and the doping concentration of the second layer is less than or equal to $10^{21}$ cm$^{-3}$.

Optionally, the ordered defect layer is a lattice structure formed by quantum dots or a defect array formed by defect structures;

a spatial scale of the quantum dots is 0.5-2 nm;

an average center distance of the quantum dots is 1-100 nm;

a material of the quantum dots is selected from at least one of a metal with a work function greater than 3.5 eV, silicon, carbon, germanium and an III-V group compound; and a spatial scale of the defect structures is 0.5-2 nm, and an average center distance of the defect structures is 1-100 nm.

Optionally, a material of the continuous thin layer is selected from one of a metal with a work function greater than 3.5 eV, boron, nitrogen, phosphorus, a mixture of boron and silicon, a mixture of nitrogen and silicon, and a mixture of phosphorus and silicon.

Optionally, a thickness of the lower transport layer is 2-20 nm;

a material of the lower transport layer is selected from one of crystalline silicon, amorphous silicon, nanocrystalline silicon, amorphous silicon carbide, nanocrystalline silicon carbide and crystalline silicon carbide, and the doping concentration of the lower transport layer is $10^{15}$-$10^{19}$ cm$^{-3}$; and a material of the first layer and a material of the second layer are selected from one of the crystalline silicon, the amorphous silicon, the nanocrystalline silicon, the amorphous silicon carbide and the crystalline silicon carbide, and both of the doping concentration of the first layer and the doping concentration of the second layer are $10^{16}$-$10^{20}$ cm$^{-3}$.

Optionally, along a direction facing the intermediate layer, the doping concentration of the lower transport layer increases progressively.

Optionally, a thickness of the upper transport layer is 2-20 nm;

a material of the upper transport layer is selected from one of crystalline silicon, amorphous silicon, nanocrystalline silicon, amorphous silicon carbide, nanocrystalline silicon carbide and crystalline silicon carbide, and the doping concentration of the upper transport layer is $10^{15}$-$10^{19}$ cm$^{-3}$; or the material of the upper transport layer is selected from one of a metal oxide, a metal selenide and a metal sulfide; or the material of the upper transport layer is selected from multi-compounds formed by doping with metal or nonmetal in the metal oxide, the metal selenide or the metal sulfide; or the material of the upper transport layer is selected from at least one of an III-V group compounds, a CIS homologues material and an intrinsic conducting polymer.

Optionally, the metal oxide is selected from one of zinc oxide, tin oxide, titanium oxide, molybdenum oxide, copper oxide, nickel oxide, vanadium oxide, tantalum oxide, hafnium oxide, niobium oxide, tungsten oxide, indium oxide and gallium oxide;

the multi-compound is selected from one of tin oxide doped with indium, tin oxide doped with fluorine, zinc oxide doped with gallium, zinc oxide doped indium gallium;

the CIS homologues material is selected from one of copper indium selenium, copper gallium sulfur, copper indium gallium selenium sulfur, copper aluminum gallium sulfur and copper zinc tin sulfur; and the intrinsic conducting polymer is selected from one of polyacetylene, polythiophene, polypyrrole, polyaniline, polyphenylene, polyphenylenevinylene and polydiacetylene.

Optionally, when the material of the upper transport layer is selected from one of crystalline silicon, amorphous silicon, nanocrystalline silicon, amorphous silicon carbide, nanocrystalline silicon carbide and crystalline silicon carbide, along a direction facing the intermediate layer, the doping concentration of the lower transport layer increases progressively.

Optionally, a thickness of the intermediate layer is 0.5-2 nm, a thickness of the tunnel junction is 4.5-50 nm.

Optionally, when a material of a light facing surface of the lower cell unit is crystalline silicon, a material of the lower transport layer is selected from crystalline silicon or crystalline silicon carbide; and the light facing surface of the lower cell unit is a surface on which the lower cell unit contacts with the lower transport layer; and when the material of the light facing surface of the lower cell unit is amorphous silicon, the material of the lower transport layer is selected from one of amorphous silicon, nanocrystalline silicon, amorphous silicon carbide and nanocrystalline silicon carbide.

Optionally, a light facing surface of the lower cell unit is provided with a light trapping structure, the light facing surface of the lower cell unit is a surface on which the lower cell unit contacts with the lower transport layer;

a shadow surface of the tunnel junction is matched with the light facing surface of the lower cell unit in shape; and the shadow surface of the tunnel junction is a surface on which the tunnel junction contacts with the light facing surface of the lower cell unit.

According to the first aspect of the present disclosure, a producing method of the tandem photovoltaic device is provided, including:

providing a lower cell unit, wherein the lower cell unit is a crystalline silicon cell;

fabricating the tunnel junction according to any one of claims 1 to 11 on a light facing surface of the lower cell unit;

depositing the upper cell unit on a light facing surface of the tunnel junction, wherein a band gap of the upper cell unit is greater than a band gap of the lower cell unit.

Optionally, the step of fabricating the tunnel junction includes:

with the light facing surface of the lower cell unit being a substrate, doping to obtain the lower transport layer; or depositing on the light facing surface of the lower cell unit to form the lower transport layer; and etching and corroding on the light facing surface of the lower transport layer to obtain the ordered defect layer.

In the embodiments of the present disclosure, the lower cell unit is a crystalline silicon cell, and the tunnel junction consists of an upper transport layer, a lower transport layer and an intermediate layer located between the upper transport layer and the lower transport layer, the upper transport layer and the lower transport layer are in direct contact with the intermediate layer, respectively. The intermediate layer is an ordered defect layer, a continuous thin layer or a double-layer structure with heavy doping, which causes more defects in the intermediate layer of the tunnel junction. The intermediate layer with more defects has strong recombination capacity, which limits the position of the carrier recombination in the intermediate layer of the tunnel junction to a large extent. Compared with the intermediate layer, the upper transport layer and the lower transport layer have less defects and stronger carrier transport capacity. Therefore, the upper transport layer and the lower transport layer basically only plays a role in the carrier transport, and basically, the intermediate layer only plays a role in recombination. The recombination center is basically limited in the intermediate layer of the tunnel junction, which improves the overall recombination rate and conductivity of the tunnel junction, and reduces the overall series resistance.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are merely embodiments of the present disclosure, and a person skilled in the art can obtain other figures according to these figures without paying creative work.

DESCRIPTION OF THE REFERENCE NUMBERS

1—upper cell unit, 2—lower cell unit, 3—tunnel junction, 31—upper transport layer, 32—lower transport layer, 33—intermediate layer, 331—first layer, and 332—second layer.

DETAILED DESCRIPTION OF THE EMBODIMENTS

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
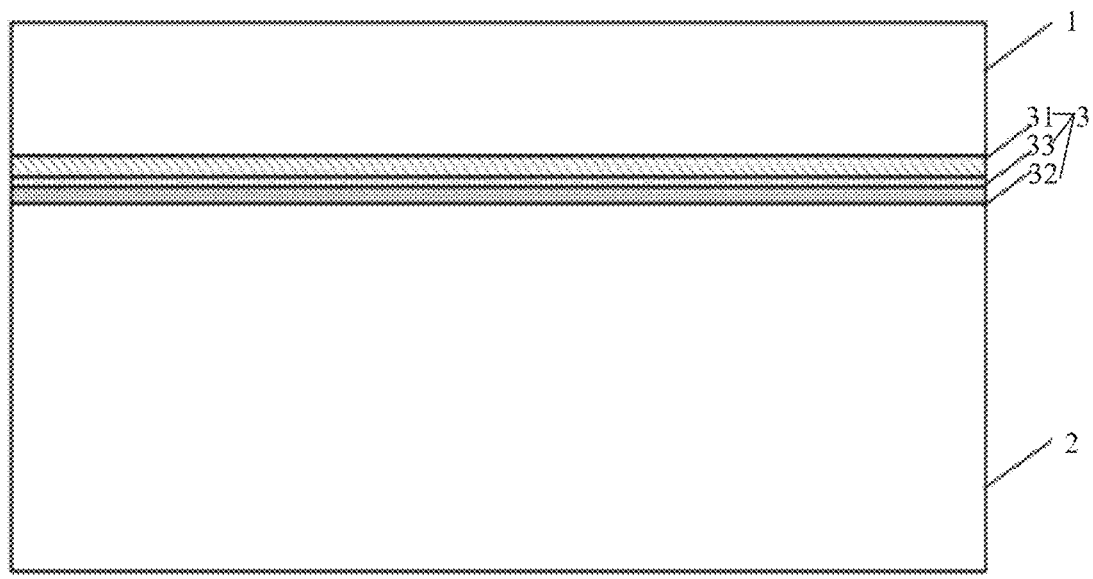
FIG. 1 illustrates a structural schematic diagram of a tandem photovoltaic device according to some embodiments of the present disclosure.

In the embodiment of the present disclosure, referring to FIG. 1, FIG. 1 illustrates a structural schematic diagram of a tandem photovoltaic device according to some embodiments of the present disclosure. The tandem photovoltaic device includes: an upper cell unit 1, a lower cell unit 2 and a tunnel junction 3 located between the upper cell unit 1 and the lower cell unit 2. The tunnel junction 3 is used to connect the upper cell unit 1 and the lower cell unit 2 in series to form the tandem photovoltaic device. It can be understood that a band gap of the upper cell unit 1 is different from a band gap of the lower cell unit 2, and the band gap of the upper cell unit 1 is greater than the band gap of the lower cell unit 2. The lower cell unit is a crystalline silicon cell. In the embodiment of the present disclosure, a quantity of the upper cell unit, a quantity of the lower cell unit and a quantity of the tunnel junction which are included in the tandem photovoltaic device are not specifically limited.

It can be understood that the tunnel junction 3 has light transmittance, which is used to transmit the remaining wave bands after absorption by the upper cell unit. The light-transmission wave bands may be determined according to the remaining wave bands after the light is absorbed by its neighboring upper cell unit. For example, the light-transmission wave bands may be the remaining wave bands after the light is absorbed by the neighboring upper cell unit.

Referring to FIG. 1, the tunnel junction 3 may include: an upper transport layer 31, a lower transport layer 32 and an intermediate layer 33 located between the upper transport layer 31 and the lower transport layer 32. The upper transport layer 31 and the lower transport layer 32 are in direct contact with the intermediate layer 33, respectively. The upper transport layer 31 corresponds to a first conducting type, the lower transport layer 32 corresponds to a second conducting type, wherein the first conducting type is different from the second conducting type. For example, when the conducting type of the upper transport layer 31 is an n-type conducting type, the conducting type of the lower transport layer 32 is a p-type conducting type. The upper transport layer 31 contacts the upper cell unit 1, and the lower transport layer 32 contacts the lower cell unit 2.

Optionally, a thickness of the lower transport layer is 2-20 nm. A material of the lower transport layer is selected from one of crystalline silicon, amorphous silicon, nanocrystalline silicon, amorphous silicon carbide, nanocrystalline silicon carbide and crystalline silicon carbide. The crystalline silicon carbide includes single crystal silicon carbide and polycrystalline silicon carbide. The materials described above are easy to realize different conducting types by doping. A doping concentration of the lower transport layer is $10^{15}$-$10^{19}$ cm$^{-3}$. The lower transport layer contacts the lower cell unit for carrier transport. Optionally, the lower transport layer may also provide energy band buffering. In some cases, the lower transport layer contacts the lower cell unit, and the lower transport layer may be doped to form a continuous band-tail state or a band-tail energy level, which plays a role in reducing the band gap width to assist to perform nonlocal recombination or energy band buffer. The lower transport layer of the materials described above contacts the crystalline silicon cell of the lower cell unit, and also has a passivation effect.

Optionally, the doping concentration of the lower transport layer increases progressively along a direction facing the intermediate layer. Accordingly, the lower transport layer contacts the crystalline silicon solar cell of the lower cell unit to provide contacting energy band buffer and carrier transport. The gradient doping of the lower transport layer forms a continuous band-tail state or a band-tail energy level, which reduces the band gap width, assists electron to perform nonlocal recombination, and further reduces the overall resistivity of the tunnel junction structure.

Optionally, a thickness of the upper transport layer is 2-20 nm. A material of the upper transport layer is selected from one of crystalline silicon, amorphous silicon, nanocrystalline silicon, amorphous silicon carbide, nanocrystalline silicon carbide and crystalline silicon carbide. The crystalline silicon carbide includes single crystal silicon carbide and polycrystalline silicon carbide. A doping concentration of the upper transport layer is $10^{15}$-$10^{19}$ cm$^{-3}$. When the material of the upper transport layer is the material described above, the materials described above are easy to realize different conducting types by doping. The upper transport layer contacts the upper cell unit for carrier transport. Optionally, the upper transport layer may also provide energy band buffer. In some cases, the upper transport layer contacts the upper cell unit, and the upper transport layer may be doped to form a continuous band-tail state or a band-tail energy level, which plays a role in reducing the band gap width to assist to perform nonlocal recombination or energy band buffer.

Or, the material of the upper transport layer is selected from one of a metal oxide, a metal selenide and a metal sulfide. Optionally, the metal oxide is selected from one of zinc oxide, tin oxide, titanium oxide, molybdenum oxide, copper oxide, nickel oxide, vanadium oxide, tantalum oxide, hafnium oxide, niobium oxide, tungsten oxide, indium oxide and gallium oxide. The upper transport layer of the above materials has good conductivity.

Or, the material of the upper transport layer is selected from multi-compounds formed by doping with metal or nonmetal in the metal oxide, the metal selenide or the metal sulfide. Optionally, the multi-compound may be selected from one of tin oxide doped with indium, tin oxide doped with fluorine, zinc oxide doped with gallium and zinc oxide doped with indium gallium. By doping metal or nonmetal in the metal oxide, the metal selenide or the metal sulfide to form the multi-compounds, the transport capacity of the upper transport layer can be improved, that is, the conductivity of the upper transport layer can be improved.

Or, the material of the upper transport layer is selected from at least one of an III-V group compound, a CIS homologues material and an intrinsic conducting polymer. Optionally, the CIS homologues material is selected from copper indium selenium ($CuInSe_2$), copper gallium sulfur ($CuGaS_2$), copper indium gallium selenium sulfur ($CuIn_xGa_{1-x}Se_yS_{2-y}$), copper aluminum gallium sulfur ($CuAlGaS_2$) and copper zinc tin sulfur ($CuZnSnS_2$). The upper transport layer of the above materials has good conductivity. It should be noted that the value of x here may be a positive number less than 1, and y may be a positive number less than 2. The values of x and y above may be adjusted according to the band gap of the upper cell unit. Further, x may be a positive number greater than or equal to 0.3 and less than 1, y can be a positive number less than or equal to 0.5, when the value of x and the value of y are in this range, the upper cell unit has a wide band gap. Optionally, the intrinsic conducting polymer is selected from one of polyacetylene, polythiophene, polypyrrole, polyaniline, polyphenylene, polyphenylenevinylene and polydiacetylene.

Optionally, when the material of the upper transport layer is selected from one of crystalline silicon, amorphous silicon, nanocrystalline silicon, amorphous silicon carbide, nanocrystalline silicon carbide and crystalline silicon carbide, the doping concentration of the lower transport layer increases progressively along a direction facing the intermediate layer. Accordingly, the gradient doping of the upper transport layer forms a continuous band-tail state or a band-tail energy level, reduces the band gap width, assists electron to perform nonlocal recombination, and further reduces the overall resistivity of the tunnel junction structure.

Optionally, when a material of a light facing surface of the lower cell unit is crystalline silicon, a material of the lower transport layer is selected from crystalline silicon or crystalline silicon carbide; and the light facing surface of the lower cell unit is a surface on which the lower cell unit contacts with the lower transport layer. Specifically, when the material of the light facing surface of the lower cell unit is crystalline silicon material, since the crystalline silicon material has good temperature tolerance and can withstand a treatment temperature more than 250° C., the material of the lower transport layer may be selected from crystalline silicon or crystalline silicon carbide. For example, the lower cell unit can be homogeneous junction crystalline silicon cell. When the material of the light facing surface of the lower cell unit is crystalline silicon material, the lower transport layer may be obtained by further directly doping the light facing surface of the lower cell unit or may also be obtained by separate deposition.

Optionally, when the material of the light facing surface of the lower cell unit is amorphous silicon, the material of the lower transport layer is selected from one of amorphous silicon nanocrystalline silicon, amorphous silicon carbide and nanocrystalline silicon carbide. Specifically, when the material of the light facing surface of the lower cell unit material is amorphous silicon material, due to the poor temperature tolerance of the amorphous silicon material, it is easy to crystallize at a treatment temperature of 250 20 C., or a higher temperature. Therefore, the material of the lower transport layer may be selected from one of amorphous silicon, nanocrystalline silicon, amorphous silicon carbide and nanocrystalline silicon carbide. For example, the lower cell unit may be a crystalline silicon/amorphous silicon heterojunction cell. In addition, when the material of the light facing surface of the lower cell unit is amorphous silicon material, the lower transport layer may be obtained by further directly doping the light facing surface of the lower cell unit or may also be obtained by separate deposition.

It should be noted that when the material of the light facing surface of the lower cell unit material is amorphous silicon material, the material of the intermediate layer may also be selected from the material which is capable of being treated and obtained at a temperature less than 250° C. For example, when the material of the light facing surface of the lower cell unit is amorphous silicon material, the intermediate layer is a double layer structure with the material being selected from amorphous silicon, nanocrystalline silicon, amorphous silicon carbide or nanocrystalline silicon carbide, or an ordered defect layer or a continuous thin layer produced at a low temperature.

In the embodiment of the present disclosure, the intermediate layer may be any one of the following three modes:

For a first mode, the intermediate layer includes a first layer contacted with the lower transport layer and a second layer contacted with the upper transport layer, a conducting type of the first layer is the same as a conducting type of the lower transport layer, the doping concentration of the first layer is 10-10000 times of the doping concentration of the lower transport layer, and the doping concentration of the first layer is less than or equal to $10^{21}$ cm$^{-3}$. For example, when the lower transport layer has a p-type conducting type, the conducting type of the first layer contacted with the lower transport layer is also the p-type conducting type, and the first layer can be p++. When the doping concentration of the first layer is less than or equal to $10^{21}$ cm$^{-3}$, a framework of the first layer will not be destroyed, the doping concentration of the first layer is 10-10000 times of a doping concentration of the lower transport layer, a gradient doping is formed between the first layer and the lower transport layer. A conducting type of the second layer is the same as a conducting type of the upper transport layer. A doping concentration of the second layer is 10-10000 times of a doping concentration of the upper transport layer, and the doping concentration of the second layer is less than or equal to $10^{21}$ cm$^{-3}$. For example, when the upper transport layer has an n-type conducting type, the conducting type of the second layer contacted with the upper transport layer is also the n-type conducting type, and the second layer may be n++. When the doping concentration of the second layer is less than or equal to $10^{21}$ cm$^{-3}$, a framework of the second layer will not be destroyed, the doping concentration of the second layer is 10-10000 times of the doping concentration of the upper transport layer, a gradient doping is formed between the second layer and the upper transport layer. Accordingly, there are more defects formed in the intermediate layer of the tunnel junction. The intermediate layer with more defects has strong recombination capacity, and limits the position of the carrier recombination in the intermediate layer of the tunnel junction to a larger extent. Compared with the intermediate layer, the upper transport layer and the lower transport layer have less defects and stronger carrier transport capacity. Therefore, the upper transport layer and the lower transport layer basically only play a role in the carrier transport, and basically, the intermediate layer only plays a role in recombination. The recombination center is basically limited in the intermediate layer of the tunnel junction, which improves the overall recombination rate and conductivity of the tunnel junction, and reduces the overall series resistance.

Figure 2:
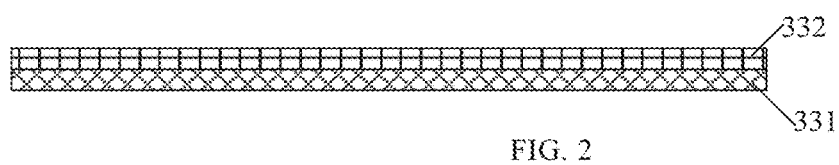
FIG. 2 illustrates a structural schematic diagram of an intermediate layer according to some embodiments of the present disclosure.

For instance, referring to FIG. 2, FIG. 2 illustrates a structural schematic diagram of an intermediate layer according to some embodiments of the present disclosure. The intermediate layer 33 includes a first layer 331 contacted with the lower transport layer 32 and a second layer 332 contacted with the upper transport layer 31.

Optionally, a material of the first layer and a material of the second layer are selected from one of crystalline silicon, amorphous silicon, nanocrystalline silicon, amorphous silicon carbide and crystalline silicon carbide. The crystalline silicon carbide includes single crystal silicon carbide and polycrystalline silicon carbide. Both of the doping concentration of the first layer and the doping concentration of the second layer are $10^{16}$-$10^{20}$ cm$^{-3}$. When the material of the first layer and the material of the second layer are selected from one of crystalline silicon, amorphous silicon, nanocrystalline silicon, amorphous silicon carbide and crystalline silicon carbide, the first layer and the second layer are more easily doped to the concentration of $10^{16}$-$10^{20}$ cm$^{-3}$.

For a second mode, the intermediate layer is an ordered defect layer, a space scale of defects of the ordered defect layer is 0.5-2 nm, and an average center distance of the defects is 1-100 nm. The intermediate layer with more defects improves the recombination rate, has strong recombination capacity and limits the position of the carrier recombination in the intermediate layer of the tunnel junction to a larger extent. Compared with the intermediate layer, the upper transport layer and lower transport layer have less defects and strong carrier transport capacity, which makes that basically the upper transport layer and lower transport layer only play a role in the carrier transport. However, basically, the intermediate layer only plays a role in recombination, and limits the recombination center only in the intermediate layer of tunnel junction, improves the overall recombination rate and conductivity of tunnel junction and reduces the overall series resistance.

Optionally, the ordered defect layer is a lattice structure formed by quantum dots or a defect array formed by defect structures. A spatial scale of the quantum dots is 0.5-2 nm. An average center distance of the quantum dots is 1-100 nm. A material of the quantum dots is selected from at least one of a metal with a work function greater than 3.5 eV, silicon, carbon, germanium and an III-V group compound. The shape of the quantum dots can be approximated as a hemisphere or a sphere whose diameter is 0.5-2 nm. As the defect center, the quantum dots improve the recombination capacity of the intermediate layer, and limit the position of the carrier recombination in the intermediate layer of the tunnel junction to a larger extent, improve the overall recombination rate and conductivity of tunnel junction and reduce the overall series resistance.

A spatial scale of the defect structures is 0.5-2 nm, and an average center distance of the defect structures is 1-100 nm. The physical defect array with controllable morphology may be introduced into the defect structures by etching and corroding and other modes on the shadow surface of the upper transport layer or the light facing surface of the lower transport layer. The shape of the defect structures can be approximated as a hemisphere or a sphere whose diameter is 0.5-2 nm. As the defect center, the defect structures also improve the recombination capacity of the intermediate layer, limit the position of the carrier recombination in the intermediate layer of the tunnel junction to a larger extent, improve the overall recombination rate and conductivity of tunnel junction and reduce the overall series resistance.

For a third mode, the intermediate layer is a continuous thin layer, when a material of the intermediate layer is a metal, a thickness of the intermediate layer is 0.5-2 nm. Compared with the upper transport layer and the lower transport layer, the metal layer with this size has more defects, which improves the recombination rate and has strong recombination capacity, and limits the position of the carrier recombination in the intermediate layer of the tunnel junction to a larger extent. When a material of the intermediate layer is a semiconductor material, a doping concentration of the continuous thin layer is $10^{20}$-$10^{21}$ cm$^{-3}$. A framework of the semiconductor material will be destroyed at the doping concentration, and more defects also formed in the intermediate layer, which also improves the recombination rate and has strong recombination capacity, and limits the position of the carrier recombination in the intermediate layer of the tunnel junction to a larger extent.

Optionally, a material of the continuous thin layer is selected from one of a metal with a work function greater than 3.5 eV, boron, nitrogen, phosphorus, a mixture of boron and silicon, a mixture of nitrogen and silicon, and a mixture of phosphorus and silicon. It should be noted that the mixtures here do not preclude bonding between atoms. A thickness of the continuous thin layer may be 0.5-2 nm. The continuous thin layer of the above materials can further improve the recombination capacity of the intermediate layer, and facilitate improving the overall recombination rate and the overall conductivity of the tunnel junction.

In the embodiment of the present disclosure, when the lower cell unit is the crystalline silicon cell, the tunnel junction consists of the upper transport layer, the lower transport layer and the intermediate layer located between the upper transport layer and the lower transport layer, the upper transport layer and the lower transport layer are in direct contact with the intermediate layer, respectively. The intermediate layer is the ordered defect layer, the space scale of the defects of the ordered defect layer is 0.5-2 nm, and the average center distance of the defects is 1-100 nm, many defects are formed in the intermediate layer of the tunnel junction. Or, the intermediate layer is the continuous thin layer, when the material of the intermediate layer is the metal material, the thickness of the intermediate layer is 0.5-2 nm, and more defects also formed in the intermediate layer. When the material of the intermediate layer is the semiconductor material, the doping concentration of the continuous thin layer is $10^{20}$-$10^{21}$ cm$^{-3}$, the framework of the semiconductor material will be destroyed at the doping concentration, and more defects also formed in the intermediate layer. Or the conducting type of the first layer contacted with the lower transport layer in the intermediate layer is the same as the conducting type of the lower transport layer; the conducting type of the second layer contacted with the upper transport layer in the intermediate layer is the same as the conducting type of the upper transport layer, the doping concentration of the first layer is less than or equal to $10^{21}$ cm$^{-3}$; and the doping concentration of the second layer is less than or equal to $10^{21}$ cm$^{-3}$. The doping concentration of the first layer is 10-10000 times of the doping concentration of the lower transport layer. The doping concentration of the second layer is 10-10000 times of the doping concentration of the upper transport layer. Accordingly, the gradient doping is formed between the first layer and the lower transport layer, and the gradient doping is formed between the second layer and the upper transport layer, and the doping concentration of the first layer and the second layer in the intermediate layer are much greater than the doping concentration of the lower transport layer and the upper transport layer which are contacted with the first layer and the second layer respectively, thus many defects are formed in the intermediate layer of the tunnel junction.

In the embodiment of the present disclosure, the intermediate layer provides the energy and the space position for carrier nonlocal recombination, which may greatly improve the carrier recombination rate in a small space region. The upper transport layer and the lower transport layer play a role in collecting and transporting the carriers in the upper transport layer and the lower transport layer. At the same time, the upper transport layer and the lower transport layer may buffer the energy band and reduce the energy level difference, facilitate the nonlocal recombination of carriers and inhibit the local recombination. The upper transport layer and the lower transport layer are relative to form an auxiliary recombination structure, which mainly play a role in providing nonlocal recombination paths for different types of carriers generated by the upper cell unit and lower cell unit.

In the embodiment of the present disclosure, the lower transport layer of the tunnel junction in the tandem photovoltaic device contacts the crystalline silicon solar cell of the lower cell unit, providing the contact energy band buffer and carrier transport, and assisting the electrons to perform nonlocal recombination. The upper transport layer contacts the upper wide band gap solar cell unit, providing carrier transport and contact band buffer to reduce the band gap width. The tunnel junction with stable intermediate band gap may suppress the local recombination of carriers to the greatest extent, reduce the energy loss caused by local recombination, realize auxiliary transport and promote nonlocal recombination, and further reduce the overall resistivity of the tunnel junction structure.

The three ways mentioned above all lead to more defects in the intermediate layer of the tunnel junction. The intermediate layer having more defects has strong recombination capacity, limits the position of the carrier recombination in the intermediate layer of the tunnel junction to a larger extent. Compared with the intermediate layer, the upper transport layer and the lower transport layer has less defects and stronger carrier transport capacity. Therefore, the upper transport layer and the lower transport layer basically only plays a role in the carrier transport, and basically, the intermediate layer only plays a role in recombination. The recombination center is basically limited in the intermediate layer of the tunnel junction, which improves the overall recombination rate and conductivity of the tunnel junction, and reduces the overall series resistance.

Optionally, the thickness of the intermediate layer is 0.5-2 nm and the thickness of the tunnel junction is 4.5-50 nm. Specifically, the thickness of the upper transport layer and the thickness of the lower transport layer is much larger than the thickness of the intermediate layer, and the transport capacity of the carriers of the upper transport layer and the lower transport layer is stronger, and the recombination capacity of the carriers of the intermediate layer is stronger. When the intermediate layer is the ordered defect layer or the single layer structure of the continuous thin layer, the thickness of the ordered defect layer and the thickness of the continuous thin layer are 0.5-2 nm. When the intermediate layer is the double layer structure formed by the first layer and the second layer, a total thickness of the first layer and the second layer is 0.5-2 nm. When the tunnel junction is thicker, the carriers need to span a larger space distance for nonlocal recombination, which may reduce the nonlocal recombination and promote the local recombination, resulting in the increase of the overall resistivity of the tunnel junction. When the tunnel junction is too thin, it is easy to cause that the excited state carriers cannot be effectively recombined in the intermediate layer. The carriers enter the adjacent cell unit (when the energy level difference is small) in a form of excited state or accumulate at the energy level interface (when the energy level difference is large). The carriers entering the adjacent cell unit in the form of excited state are easy to participate in the recombination in the adjacent cell unit, resulting in the loss of the energy of the photogenerated carriers. The accumulating carries may have an influence on collecting and transporting the subsequent carriers by the tunnel junction. The tunnel junction with the thickness mentioned above takes into account the requirements of non-local recombination, recombination rate, and band buffer. Further, the thickness of the tunnel junction is 10-25 nm, in this thickness range, the performances of nonlocal recombination, recombination rate and band buffer are better.

Optionally, the light facing surface of the lower cell unit is provided with a light trapping structure, the light facing surface of the lower cell unit is a surface on which the lower cell unit contacts with the lower transport layer. A shadow surface of the tunnel junction is matched with the light facing surface of the lower cell unit in shape. The shadow surface of the tunnel junction is a surface on which the tunnel junction contacts with the light facing surface of the lower cell unit. The light trapping structure may be a nano optical structure, a textured structure, etc. The nanometer optical structure is a regular nanometer light trapping structure. The textured structure has a pyramid, an inverted pyramid and so on. The light trapping structure is disposed on the light facing surface of the lower cell unit, the shadow surface of the tunnel junction is matched with the light facing surface of the lower cell unit in shape. Then, the shadow surface of the tunnel junction is also provided with a light trapping structure to which facilitate increasing the optical path. At the same time, the structure and the material of the tunnel junction facilitate obtaining the tunnel junction with uniform thickness and uniform function on the light trapping structure of the light facing surface of the lower cell unit.

Figure 3:
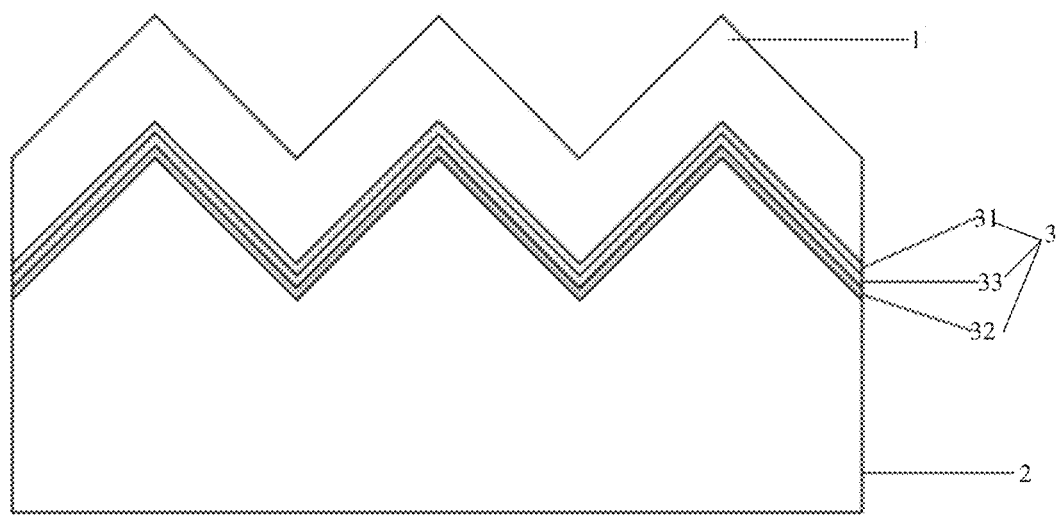
FIG. 3 illustrates a structural schematic diagram of another tandem photovoltaic device according to some embodiments of the present disclosure.

For example, referring to FIG. 3, FIG. 3 illustrates a structural schematic diagram of another tandem photovoltaic device according to some embodiments of the present disclosure. In the tandem photovoltaic device, the light facing surface of the lower cell unit 2 has a light trapping structure, the shadow surface of the tunnel junction 3 has a light trapping structure that is matched with the shape of the light facing surface of the lower cell unit 2. The light facing surface of the tunnel junction 3 has a light trapping structure, the shadow surface of the upper cell unit 1 has a light trapping structure that is matched with the shape of the light facing surface of the tunnel junction 3. The light facing surface of the upper cell unit 1 has a light trapping structure. It should be noted that the thickness of the tunnel junction is only 4.5-50 nm, the thickness is thin, which is conducive to the formation of a light trapping structure in the shadow surface of the tunnel junction that is matched with the shape of the light facing surface of the lower cell unit.

In the embodiment of the present disclosure, the lower cell unit is the crystalline silicon cell. The doping type of substrate silicon material of the lower cell unit is not limited, which may be a positive pn junction structure or a back pn junction structure, a single-sided or a double-sided structure, that is, the bottom electrode may be a whole metal back field or a local grid line. The light facing surface of the lower cell unit has a planar structure or a light trapping structure. Insulative materials or dielectric materials, such as conventional passivation layer or antireflection layer, cannot cover the top of the light facing surface of the lower cell unit to facilitate electrical contact with the tunnel junction. However, the top of the light facing surface of the lower cell unit may be covered with an oxide tunneling passivation layer and a polycrystalline transport layer, such as TOPCon (Tunnel Oxide Passivated Contact) structure, and may also be covered with an amorphous silicon/crystalline silicon heterojunction structure, such as a HJT structure. The shadow surface of the lower cell unit may directly cover the electrode. In order to improve the photoelectric conversion efficiency of the lower cell unit, any structure can be designed on the shadow surface of the lower cell unit, such as: electrical derived structures (PERC (Passivated Emitter and Rear Contact)) used for producing the passivation layer and the openings, or comprehensive or locally heavy doping (PERT (Passivated Emitter and Rear Totally-Diffused), PERL (Passivated Emitter and Rear Locally-Diffused)) further adopted, or an oxide tunneling passivation layer and polycrystalline transport layer structure (TOPCon), or the amorphous silicon/crystal tunneling heterojunction structure (HJT) may be used.

In the embodiment of the present disclosure, the upper cell unit is not specifically limited. For example, the band gap of the upper cell may be 1.5 eV-2.3 eV, For example, the band gap of the upper cell may be 1.7 eV-1.8 eV. For example, the upper cell unit may be: a perovskite thin film solar cell, an organic thin film solar cell, a quantum dot thin film solar cell, an amorphous silicon thin film solar cell, an amorphous silicon carbide thin film solar cell, a copper indium gallium selenium thin film solar cell, a cadmium telluride thin film solar cell, a gallium arsenide thin film solar cell and so on. The upper cell unit may include one or more buffer layers or matching layers required for contacting the upper transport layer in the tunnel junction to reduce the resistance or recombination between the tunnel junction and the upper cell unit. The buffer layer or the matching layer plays a role in contacting with the upper transport layer of the tunnel junction, collecting and transporting the carriers of the upper cell unit. At the same time, the buffer layer or the matching layer may also play a role in band buffer, band matching, lattice matching and reducing contact resistance and so on, so as to further reduce the series resistance of the whole device.

In the embodiment of the present disclosure, the upper cell unit may be a semiconductor thin film solar cell or an exciton material thin film solar cell.

The semiconductor thin film solar cell is a thin film solar cell with wide-band gap or adjustable-band gap semiconductor materials as the absorption layer materials. Material of thin film solar cells can be selected from amorphous silicon, CIGS (copper, indium, gallium, tin) and homogeneous materials thereof, cadmium telluride, gallium arsenide, indium phosphate and so on. The thin film solar cell of this type usually includes: a substrate material and a bottom electrode, a semiconductor absorption layer, an inversion layer or a buffer layer, a window layer, a transparent a conducting thin film, a top electrode, etc., from bottom to top. As the upper cell unit in the present disclosure, the semiconductor thin film solar cell needs to maintain the transmittance of the medium-long wave band in the visible light band of the solar spectrum. Therefore, an opaque substrate and an opaque bottom electrode are not made at the bottom of the semiconductor thin film solar cell, and the bottom window layer may be made to conduct electrical contact with the second doping film of the tunnel junction.

The exciton material thin film solar cell is a thin film solar cell with materials exposed to light to produce excitons as the absorbing layer materials. Related materials include perovskite, organic materials, quantum dots materials, dye sensitized materials, etc. The thin film solar cell of this type usually needs to include: an electrode, a transparent conductive film, an electron transport layer or n-type layer, an exciton material absorption layer, a hole transport layer or p-type layer, a transparent conducting film, an electrode, etc. As the upper cell unit in the present disclosure, the electrode is not made at the bottom of the upper cell unit, and the upper cell unit electrically contacts the second doping type film of the tunnel junction. Some materials of the exciton material thin film cell transport layer are the same as the second doping type thin film of the tunnel junction, which may be merged, such as $TiO_2$, $ZnO:Al$, $SnO_2:In$ and so on.

In the embodiment of the present disclosure, the top of the uppermost cell unit and the bottom of the lowermost cell unit may have electrodes. The top of the uppermost cell unit may also have one or more antireflection films. The electrode at the bottom of the lowermost cell unit may be either the whole metal back field (single-sided cell), or the grid line (double-sided cell). The upper cell unit and the lower cell unit need electrical and optical adaptation.

Several specific tandem photovoltaic devices are listed below:

For a first kind: the lower cell unit is homogeneous junction silicon solar cells, such as Al-BSF (Al Back Surface Field), PERX, TOPCon cells and so on. The light facing surface of the lower cell unit has a crystalline silicon structure, which may be a plane (polished surface), a textured surface or a nano-optical trapping structure and so on. The lower cell unit may withstand a treatment temperature above 250° C. The material and process selection range of the subsequent tunnel junction and the upper cell unit are wide, the process and the material at high temperature or low temperature can be selected.

An n-type diffusion layer is usually made on a p-type silicon sheet by using a thermal diffusion method to form a pn junction in the structure of the Al-BSF cell. A p+ layer with a high doping concentration is formed on the p-type substrate on the back of the cell by boron doping or deposition of aluminum layer and sintering. A p+/p high-low junction is added on the back of the conventional cell to form the back electric field. Its effect makes the electron-hole pairs generated at the back of the base area accelerate diffusion to the pn junction, and improves the collection efficiency of photogenerated carriers, thereby improving the efficiency of the cell, especially improving the spectral response of the long-wave part. The front of the cell may diffuse n+ layer to form selective contact. As the lower cell unit in the present disclosure, the upper surface may be a conventional texturing structure, a small-size texturing structure, a planar structure or a nano optical structure. There is no deposition of the antireflection film on the surface of an insulating material such as SiNx material, and there can be a conducting selective contact material or an antireflection film. The electrical contact of the surface with the first doped film of the tunnel junction is retained.

The lower transport layer of the tunnel junction contacts the light facing surface of the crystalline silicon solar cells. The materials of the lower transport layer can be crystalline silicon, amorphous silicon, nanocrystalline silicon, amorphous silicon carbide, nanocrystalline silicon carbide or crystalline silicon carbide. This kind of material realizes different conducting types by doping, and the doping concentration is $10^{15}$-$10^{19}$ cm$^{-3}$. In addition, gradient doping may also be used, for example, the closer to the intermediate layer, the higher the doping concentration is, to realize the auxiliary transport and promote the nonlocal recombination, and the overall resistivity of the tunnel junction may be further reduced. The lower transport layer corresponds to a second conducting type. The doping type of the lower transport layer is the same as the doping type of the contact area of the lower cell unit, and the doping concentration is slightly higher than the doping type of the contact area of the lower cell unit.

For example, the lower transport layer may be selected as polycrystalline silicon or monocrystalline silicon or other crystalline silicon materials, or obtained by further doping on the surface of the lower cell unit. The thickness of the lower transport layer is 2-20 nm. if it is obtained by further doping, the thickness of the lower transport layer is calculated from the position where the doping concentration is increased.

The intermediate layer of the tunnel junction may be a layer structure or a double layer structure with a thickness of 0.5-2 nm. The double layer structure may be crystal silicon, amorphous silicon, nanocrystalline silicon, amorphous silicon carbide or crystal silicon carbide (n++/p++) with an opposite conducting type and a very high doping concentration. The doping concentration is $10^{16}$-$10^{20}$ cm$^{-3}$. The second layer contacting with the upper transport layer has the same conducting type as that of the upper transport layer, but the doping concentration of the second layer is higher than the doping concentration of the upper transport layer.

The first layer contacting with the lower transport layer has the same conducting type as that of the lower transport layer, but the doping concentration of the first layer is higher than the doping concentration of the lower transport layer. The double layer structure may be obtained by further doping on the light facing surface of the lower transport layer.

The intermediate layer of the tunnel junction may be a single layer structure, such as a lattice structure formed by quantum dots, a defect array formed by defect structure, or a continuous thin layer. The material of the lattice structure may be a quantum dot mixed by any one or more material of a metal with a work function greater than 3.5 eV, silicon, carbon, germanium. The material of the lattice structure may also be a quantum dot of an III-V group compound. The lattice structure may be obtained by a variety of processes, such as evaporation, atomic layer deposition, vapor deposition, sputtering, chemical bath, electroplating, solution self-assembly process.

The defect array formed by the defect structure may be a physical defect array with controllable morphology introduced by etching and etching and corroding and other modes on the light facing surface of the lower transport layer or the shadow surface of the upper transport layer. The defect array may be obtained by ion etching, chemical etching and laser etching and other processes.

The material of the continuous thin layer structure may be a metal with a work function greater than 3.5 eV, a nonmetal such as boron, nitrogen, phosphorus, or a mixed material of the nonmetal and silicon. Or, the material of the continuous thin layer structure may be a metal material or a nonmetal material, a producing process of the continuous thin layer structure is the same as the producing process of the lattice structure. A mixed material of the nonmetal and silicon may be obtained by mixed deposition, co-deposition or injection.

The upper transport layer of the tunnel junction corresponds to the first conducting type. A thickness of the upper transport layer is 2-20 nm. A conducting type of the upper transport layer is the same as the conducting type of the lower layer (the contact layer with the upper transport layer) of the upper cell unit. The material of the upper transport layer may include crystalline silicon, amorphous silicon, nanocrystalline silicon, amorphous silicon carbide, nanocrystalline silicon carbide or polycrystalline silicon carbide. Different conducting types may be achieved by doping the material of this type (the principle is the same as that of crystalline silicon cell doped to form P type or N type). The doping concentration is $10^{15}$-$10^{19}$ cm$^{-3}$. In addition, the auxiliary transport may be realized by the gradient doping (the closer to the intermediate layer, the higher the doping concentration) and the nonlocal recombination may be promoted and the overall resistivity of tunnel junction structure may be further reduced.

In addition, the material of the upper transport layer may also include metal oxides, such as zinc oxide, tin oxide, titanium oxide, molybdenum oxide, copper oxide, nickel oxide, vanadium oxide, tantalum oxide, hafnium oxide, niobium oxide, tungsten oxide, indium oxide and gallium oxide. The material of the upper transport layer may also include selenides or sulfides of the metals mentioned above, and binary or multivariate compounds formed by using metal/non-metal to dope to the above compounds, such as tin oxide doped with indium, tin oxide doped with fluorine, zinc oxide doped with gallium and zinc oxide doped with indium gallium. In addition, the material of the upper transport layer can also include an III-V group compound, a CIS homologues material and an intrinsic conducting polymer. The CIS homologues material may include ternary or quaternary compounds such as $CuInSe_2$, $CuGaS_2$, $CuIn_xGa_{1-x}Se_yS_{2-y}$, $CuAlGaS_2$ and $CuZnSnS_2$. The intrinsic conducting polymers may be polyacetylene, polythiophene, polypyrrole, polyaniline, polyphenylene, polyphenylenevinylene and polydiacetylene, and doping materials thereof.

Optionally, the material of the upper transport layer may be matched with the material of the lower layer of the upper cell unit. The same or similar material with the buffer layer or matching layer of the lower layer of the upper cell unit is used, or a layer of material are shared to form the upper transport layer.

For the first kind of tandem photovoltaic devices, three tandem photovoltaic devices are listed below with the lower cell units being homogeneous junction silicon solar cells.

For a first one, the overall structure of the tandem photovoltaic devices is the homogeneous junction silicon solar cells/p+/p++n+/n+/electron transport layer/perovskite.

Specifically, the lower cell unit is the homogeneous junction silicon solar cell. Using a p-type silicon sheet, a pn junction is formed by the n-type layer prepared in the form of thermal diffusion or ion injection. The pn junction is located on the shadow surface of the lower cell unit. In order to improve the photoelectric conversion efficiency of the lower cell unit, the passivation layer and the electrical export structure (PERC) with an opening may be produced on the shadow surface of the lower cell unit, and comprehensive or locally heavy doping (PERT、PERL) is further adopted on the shadow surface. The light facing surface of the lower cell unit may be a polished surface, in order to reduce the optical loss, the nano optical structure or the textured structure may be produced on the light facing surface of the lower cell unit. The light facing surface of the lower cell unit may be diffused or injected in the heavy doping layer, or deposited the tunneling passivation layer and transport layer. Dielectric materials or antireflective thin films are not deposited on the light facing surface of the lower cell unit to facilitate electrical contact with the transparent transport layer. Here, the light facing surface of the lower cell unit is diffused with a p+ layer, the doping concentration is 3-8×$10^{17}$ cm$^{-3}$. The light trapping structure of pyramid textured surface is produced by using the conventional texturing scheme on the light facing surface.

The p+-type doped crystal silicon was produced on the light facing surface of the lower cell unit as the lower transport layer. The doping concentration is slightly higher than the doping concentration of the light facing surface of the lower cell unit, but it was not doped to degenerate. The doping concentration reached an order of $10^{18}$ cm$^{-3}$, and the thickness of the lower transport layer is 5-10 nm. The lower transport layer was obtained by a process of the ion injection doping directly on the surface of the p+ layer on the lower cell unit. The ion injection depth is 5-10 nm, and the gradient concentration may be obtained. The doping concentration sequentially decreased from the surface to the interior, until the doping concentration at the bottom of this layer is the same as the doping concentration at the p+ layer on the lower cell unit. The injection of the doped elements requires thermal activation. The high temperature step is carried out with the subsequent high temperature step at a same time.

The intermediate layer is produced on the light facing surface of the upper transport layer, and the p++ doping is performed by using ion injection. The injection depth is 2 nm. The doping concentration of the intermediate layer is higher than the doping concentration of the light facing surface of the lower transport layer. The doping concentration of the intermediate layer reaches an order of $10^{19}$ cm$^{-3}$. The n++ doping is performed by using ion injection. The injection depth is 1 nm. The doping concentration is greatly improved. The doping concentration of the intermediate layer reaches an order of $10^{19}$ cm$^{-3}$. The injection of the doped elements requires thermal activation. The high temperature step is carried out with the subsequent high temperature step at a same time.

A thin layer heavy doping n+-type amorphous silicon is deposited on the above doping surface. The doping concentration is an order of $10^{18}$ cm$^{-3}$ and the thickness of the amorphous silicon is 5-10 nm.

An n+ polysilicon upper transport layer is formed by crystallizing the amorphous silicon by using rapid annealing, and doped impurities are activated. The transverse grain size of grains of the n+ polysilicon layer reaches micron level and passes through this type of film. The polycrystalline layers of n++ and p++ layers form an intermediate layer. The gradient doping concentration at the n+/n++ interface and p+/p++ interface may be formed during the annealing process, which is conducive to the transport and auxiliary recombination of the carriers.

The upper cell unit is a thin film cell with a wide band gap absorption layer, and the band gap is 1.5-2.3 eV. For example, perovskite solar cells have a band gap of 1.7 eV. Firstly, SnO2 thin film is deposited on the light facing surface of the upper transport layer as the electron transport layer of the upper cell unit, and energy band matching with the upper transport layer of the tunnel junction is performed. This layer is formed by deposition using ALD process with a thickness of about 20-30 nm. Then C60 coating is evaporated on this layer as the electron transport layer. Then perovskite materials are produced by a two-step method. The thickness of the perovskite coating is 300-800 nm. The thickness should be considered for electrical and optical matching of the overall device, and then the hole transport layer is evaporated.

The overall bottom and top of the device are provided with metal electrodes to collect and export the carriers. The top of the device has a layer or multilayer antireflection film to reduce the overall optical loss of the device.

For a second one: the overall structure of the tandem photovoltaic device is: homogeneous junction silicon solar cells/p+/ordered defect layer/SnO$_2$/perovskite.

Specifically, the lower cell unit is a homogeneous junction silicon solar cell. Using the p-type silicon sheet, a pn junction is formed by the n-type layer prepared in the form of thermal diffusion or ion injection. The pn junction is located on the shadow surface of the lower cell unit. In order to improve the photoelectric conversion efficiency of the lower cell unit, the passivation layer and electrical export structure (PERC) with an opening may be produced on the shadow surface of the lower cell unit, and comprehensive or locally heavy doping (PERT、PERL) is further adopted on the shadow surface. The light facing surface of the lower cell unit may be a polished surface, in order to reduce the optical loss, the nano optical structure or the textured structure may be produced on the light facing surface of the lower cell unit. The light facing surface of the lower cell unit may be diffused or injected in the heavy doping layer, or deposited the tunneling passivation layer and transport layer. Dielectric materials or antireflective thin films are not deposited on the light facing surface of the lower cell unit to facilitate electrical contact with the transparent transport layer.

Here, the light facing surface of the lower cell unit is diffused with a p+ layer, the doping concentration is 3-8× $10^{17}$ cm$^{-3}$. The inverted pyramid textured structure is made on the light facing surface of the lower cell unit. The average edge length of the structure is 500 nm, the average edge distance is 5 nm, and the structure depth is 250-500 nm. The inverted pyramid structure is obtained by anisotropic etching assisted by metal ions.

The p+-type doped crystal silicon was produced on the light facing surface of the lower cell unit as the lower transport layer. The doping concentration of the lower transport layer is slightly higher than the doping concentration of the light facing surface of the lower cell unit, but it was not doped to degenerate. The doping concentration reached an order of $10^{18}$ cm$^{-3}$, and the thickness of the lower transport layer is 5-10 nm. The lower transport layer was obtained by a process of the ion injection doping directly on the surface of the p+ layer on the lower cell unit. The ion injection depth is 5-10 nm, and the gradient concentration may be obtained. The doping concentration sequentially decreased from the surface to the interior, until the doping concentration at the bottom of this layer is the same as the doping concentration at the p+ layer on the lower cell unit. The doped elements by the injection needs to be thermally activated and the rapid annealing process is used.

Particularly, before producing the lower transport layer, the light facing surface of the crystalline silicon may be passivated by using the ultra-thin oxide films, the oxide is SiO$_2$, a thickness is 0.5-1.5 nm. Thermal oxidation or wet oxidation are used. When the process is used, the lower transport layer is produced by depositing the p+ doping amorphous silicon by PECVD and performing the rapid annealing process. The doping concentration reached an order of $10^{18}$ cm$^{-3}$, and the thickness of the film after annealing is 5-10 nm.

The metal thin film deposited on the light facing surface of the lower transport layer is regarded as the intermediate layer, and the metal is indium. The thin film is deposited by evaporation. The thickness of the thin film is 0.5-1.5 nm, and the indium thin film is an island discontinuous thin film.

The upper transport layer is produced on the intermediate layer, and the SnO$_2$ thin film is deposited by evaporation method, the thickness of the thin film is 10-20 nm. The SnO$_2$ thin film may be used as the band buffer and the electron transport layer of the upper cell unit at a same time.

The upper cell unit is a thin film cell with a wide band gap absorption layer, and the band gap is 1.5-2.3 eV. For example, perovskite solar cells have a band gap of 1.7 eV. Then C60 coating is evaporated on the upper transport layer as the electron transport layer. Then perovskite materials are produced by a two-step method. The thickness of the perovskite coating is 300-800 nm. The thickness should be considered for electrical and optical matching of the overall device, and then the hole transport layer is evaporated.

The overall bottom and top of the device are provided with metal electrodes to collect and export the carriers. The top of the device has a layer or multilayer antireflection film to reduce the overall optical loss of the device.

For a third one: the overall structure of tandem photovoltaic devices is: homogeneous junction silicon solar cells/n+/ordered defect layer/p+/buffer layer/CIGS.

Specifically, the lower cell unit is a homogeneous junction silicon solar cell. Using the n-type silicon sheet, a pn junction is formed by the p-type layer prepared in the form of thermal diffusion or ion injection. The pn junction is located on the shadow surface of the lower cell unit. In order to improve the photoelectric conversion efficiency of the lower cell unit, the passivation layer and electrical export structure (PERC) with an opening may be produced on the shadow surface of the lower cell unit, and comprehensive or locally heavy doping (PERT、PERL) is further adopted on the shadow surface of the lower cell unit. The light facing surface of the lower cell unit may be a polished surface, in order to reduce the optical loss, the nano optical structure or the textured structure may be produced on the light facing surface of the lower cell unit. The light facing surface of the lower cell unit may be diffused or injected in the heavy doping layer, or deposited the tunneling passivation layer and transport layer. Dielectric materials or antireflective thin films are not deposited on the light facing surface of the lower cell unit to facilitate electrical contact with the transparent transport layer.

Here, the light facing surface of the lower cell unit is deposited with a $SiO_2$ tunneling passivation layer. An n+ polysilicon transport layer is deposited on the tunneling layer, and the doping concentration is $3-8 \times 10^{17}$ $cm^{-3}$. The light facing surface of the lower cell unit is conventional texturing structure. The n+-type doped crystal silicon was produced on the light facing surface of the lower cell unit as the lower transport layer. The doping concentration is slightly higher than the doping concentration of the light facing surface of the lower cell unit, but it was not doped to degenerate. The doping concentration reached an order of $10^{18}$ $cm^{-3}$, and the thickness of the lower transport layer is 5-10 nm. The lower transport layer was obtained by a process of the ion injection doping directly on the surface of the n+ layer on the lower cell unit. The ion injection depth is 5-10 nm, and the gradient concentration may be obtained. The doping concentration sequentially decreased from the surface to the interior, until the doping concentration at the bottom of this layer is the same as the doping concentration at the n+ layer of the lower cell unit. The doped elements by the injection needs to be thermally activated and the rapid annealing process is used. This annealing process may be carried out with the annealing of the n+ polycrystalline silicon transport layer of the above crystalline silicon solar cell at a same time.

The intermediate layer is produced on the light facing surface of the lower cell unit. The intermediate layer is the defect array formed by the defect structures, and is obtained by argon ion scanning etching. An accelerating voltage of an argon ion gun is 5 kV. A depth of a single etching point is 0.5-1 nm. The center distance of the etching point is 1-2 nm.

A layer of p+ polysilicon deposited on the surface of the metal layer is regarded as the upper transport layer. The doping amorphous silicon may be deposited by sputtering method and annealed. The doping concentration is similar to or the same as the doping concentration of the n+ layer. The thickness of the layer is 5-20 nm, and the transverse size of the grain is micron level and passes through the thin film.

The upper cell unit is a thin film cell with a wide band gap absorption layer, and the band gap is 1.5-2.3 eV. For example, $CuGaSe_2$ thin film solar cells have a band gap of 1.7 eV. Firstly, $MoSe_2$ is deposited on the light facing surface of the upper transport layer as the buffer layer, and energy band matching with the upper transport layer of the tunnel junction is performed. The layer is deposited by using ALD process with a thickness of about 20-30 nm. Then $CuGaSe_2$ thin film is deposited on this layer by a co-evaporation process. The thickness of the thin film is 300-1000 nm. The thickness should be considered for electrical and optical matching of the overall device. Then, ZnS buffer layer film, ZnO window layer film and TCO top thin film are deposited by sputtering.

The overall bottom and top of the device are provided with metal electrodes to collect and export the carriers. The top of the device has a layer or multilayer antireflection film to reduce the overall optical loss of the device.

For a second kind:

the lower cell unit is SHJ (Silicon/amorphous silicon heterojunction) solar cells. A material of the light facing surface of the lower cell unit is doped amorphous silicon material. The surface structure may be a plane, a textured surface or a nano-optical trapping structure. The amorphous silicon material has poor temperature tolerance, and the subsequent tunnel junction and upper cell unit material and process temperature are not more than 250° C.

SHJ (Silicon Heterojunction): usually, n-type monocrystalline silicon sheets are used as basic materials. The upper and lower surfaces of n-type monocrystalline silicon sheets may be a conventional textured surface, a small textured surface or a planar structure. The intrinsic amorphous silicon and the doping amorphous silicon are deposited on the upper and lower surfaces respectively, forming an a-Si:n/a-Si:i/c-Si:n/a-Si:i/a-Si:p symmetric structure, which can be illuminated on both sides. As the lower cell unit in the present disclosure, there is no requirement for the upper and lower arrangement of n and p polarity of the lower cell unit, and no electrode is deposited on the upper surface, and the electrical contact of the surface with the first doped film of tunnel junction is retained.

Crystalline silicon/non-silicon material heterojunction: different from the crystal silicon/amorphous silicon material heterojunction mentioned above, the pn junction of the cell structure consists of crystal silicon materials and non-silicon materials. The non-silicon materials include oxide semiconductor materials, selenide semiconductor materials, germanium and homo-compound materials, and III-V semiconductor materials, such as $SnO_2$, $ZnO$, $BaSi_2$, $SiC_xGe_{1-z}$. The value of z is a positive number less than 1. According to the pn characteristics of non-silicon materials, the silicon sheets usually are selected from monocrystalline silicon sheets with different doping types from the non-silicon materials. The surface of silicon sheets may be a conventional textured surface, a small-size textured surface, a nano-light trapping structure or a plane. A side of the non-silicon materials is usually used as the main incident surface of light, on which is usually deposited the transparent conducting thin film to collect and transport the carriers. As the lower cell unit in the present disclosure, the grid line or the antireflection film are no longer deposited on the transparent conducting thin film, the electrical contact of the surface with the first doped film of tunnel junction is retained.

The lower transport layer of the tunnel junction contacts the amorphous silicon material of the light facing surface of the crystalline silicon solar cell. Amorphous or nanocrystalline materials such as amorphous silicon, nanocrystalline silicon, amorphous silicon carbide and nanocrystalline silicon carbide deposited at low temperature may be selected. These materials realize different conducting types by doping, and the doping concentration is $10^{16}$-$10^{20}$ $cm^{-3}$. In addition, a gradient doping (the closer to the intermediate layer, the higher the doping concentration) may realize auxiliary transport and promote nonlocal recombination, and further reduce the overall resistivity of the tunnel junction structure. The lower transport layer corresponds to the second conducting type, the doping type thereof is the same as the doping type of the contacting area of the lower cell unit, and the doping concentration is slightly higher than the doping concentration of the contacting area of the lower cell unit.

More preferably, the lower transport layer may be selected as the amorphous silicon material or the nanocrystalline silicon material, or obtained by further doping to the amorphous silicon material of the light facing surface of the lower cell unit. The thickness of the lower transport layer is 2-20 nm. If it is obtained by further doping, the thickness of the lower transport layer is calculated from the position where the doping concentration is increased.

The intermediate layer of the tunnel junction may be a layer structure or a double layer structure with a thickness of 0.5-2 nm. The double layer structure may be crystal silicon, amorphous silicon, nanocrystalline silicon, amorphous silicon carbide or crystal silicon carbide (n++/p++) with an opposite conducting type and a very high doping concentration. The doping concentration is $10^{16}$-$10^{20}$ cm$^{-3}$. The layer contacting with the upper transport layer has the same conducting type as that of the upper transport layer, but the doping concentration of the layer is higher than the doping concentration of the upper transport layer. The layer contacting with the lower transport layer has the same conducting type as that of the lower transport layer, but the doping concentration of the layer is higher than the doping concentration of the lower transport layer. More preferably, the double layer structure may be obtained by further doping on the light facing surface of the lower transport layer.

When the intermediate layer of the tunnel junction is a single layer structure, it may be the same as the intermediate layer of the single layer in the first kind of the tandem photovoltaic device mentioned above, and the producing process is also the same, which is not repeated.

The upper transport layer of the tunnel junction may be the same as the upper transport layer of the single layer in the first kind of the tandem photovoltaic device mentioned above, and the producing process is also the same, which is not repeated.

For the second kind of the tandem photovoltaic device, there are two tandem photovoltaic devices with the lower cell unit being the heterojunction silicon solar cells listed below.

First: the overall structure of the tandem photovoltaic device is: heterojunction silicon solar cells/n+/n++p++/p+/hole transport layer/perovskite.

Specifically, the lower cell unit is the heterojunction silicon solar cell (SHJ, HJT). Using an n-type silicon sheet, the intrinsic amorphous silicon and the doping amorphous silicon are deposited on both sides to form a-Si:p+/a-Si:i/c-Si:n/a-Si:i/a-Si:n+ symmetric structure. The n+ amorphous silicon layer is located in the light facing surface of the lower cell unit, and the p+ layer is located in the shadow surface of the lower cell unit. The light facing surface and the shadow surface of the lower cell unit have the textured light trapping structure. The doping concentration of the n+ layer of the light facing surface is $4\times10^{18}$-$9\times10^{18}$ cm$^{-3}$. The dielectric materials or the antireflective thin film are not deposited on the light facing surface of the lower cell unit to facilitate electrical contact with the transparent transport layer.

The lower transport layer is produced on the light facing surface of the heterojunction cell mentioned above, and the material of the lower transport layer is amorphous silicon, which is obtained by further doping directly on the surface of the upper n+ amorphous silicon of the lower cell unit. The doping concentration is slightly higher than the doping concentration of the n+ amorphous silicon layer, and reaches an order of $10^{19}$ cm$^{-3}$. The producing process of this layer is integrated with the producing process of the n+ amorphous silicon layer. When the amorphous silicon is deposited, the method of increasing the flow rate of doping gas source is used. The thickness of this layer is 5-10 nm.

The intermediate layer is produced on the surface of the upper transport layer. The intermediate layer is anti-type heavily doped bilayer structure and is deposited by PECVD, and the layer of the intermediate layer contacted with the lower transport layer is an n++ layer. The p++ layer is covered on the n++ layer. The doping concentration reaches an order of $10^{20}$ cm$^{-3}$. The thickness of the n++ layer and the p++ layer is 0.5-1 nm, respectively, and the total thickness of the double layer is 1-2 nm.

The lower transport layer p+ amorphous silicon is produced on the intermediate layer and deposited by PECVD. The doping concentration reaches an order of $10^{19}$ cm$^{-3}$, and the thickness of this layer is 5-10 nm.

The upper cell unit is a thin film cell with a wide band gap absorption layer, and the band gap is 1.5-2.3 eV. For example, perovskite solar cells have a band gap of 1.7 eV. Firstly, spiro-OMeTAD thin film is deposited on the light facing surface of the upper transport layer as the hole transport layer of the upper cell unit, and energy band matching with the upper transport layer of the tunnel junction is performed. The hole transport layer is formed by deposition using a spin coating process with a thickness of about 20-30 nm. Then perovskite materials are produced by a two-step method. The thickness of the perovskite coating is 300-800 nm. The process temperature of the two-step method is not more than 250° C., and the thickness should be considered for electrical and optical matching of the overall device, and then the electron transport layer is spin coated.

The overall bottom and top of the device are provided with metal electrodes to collect and export the carriers. The top of the device has a layer or multilayer antireflection film to reduce the overall optical loss of the device.

Second: the overall structure of the tandem photovoltaic device is: heterojunction silicon solar cell/p+/P—Si/TiO$_2$/perovskite.

Specifically, the lower cell unit is the heterojunction silicon solar cell (SHJ, HJT). Using an n-type silicon sheet, the intrinsic amorphous silicon and the doping amorphous silicon are deposited on both sides to form a-Si:n+/a-Si:i/c-Si:n/a-Si:i/a-Si:p+ symmetric structure. The n+ amorphous silicon layer is located in the shadow surface of the lower cell unit, and the p+ layer is located in the light facing surface of the lower cell unit. The shadow surface of the lower cell unit has the textured light trapping structure, the light facing surface is a planar structure. The doping concentration of the p+ layer of the light facing surface of the lower cell unit is $1\times10^{16}$-$9\times10^{17}$ cm$^{-3}$. The dielectric materials or the antireflective thin film are not deposited on the light facing surface of the lower cell unit to facilitate electrical contact with the transparent transport layer.

The lower transport layer is produced on the light facing surface of the heterojunction cell mentioned above, and the material of the lower transport layer is amorphous silicon, which is obtained by further doping directly on the surface of the upper p+ amorphous silicon of the cell. The producing process of this layer is integrated with the producing process of the n+ amorphous silicon layer. When the amorphous silicon is deposited, the method of increasing the flow rate of doping gas source is used. The thickness of this layer is 5-10 nm. The gradient doping is used in this layer, and the doping concentration sequentially increased from bottom to the surface. The doping concentration of the lower layer is slightly higher than the doping concentration of the p+ amorphous silicon layer, and reaches $10^{18}$ cm$^{-3}$, the doping concentration of the surface reaches an order of $10^{19}$ cm$^{-3}$.

The intermediate layer is produced on the light facing surface of the lower transport layer mentioned above. The intermediate layer is a single layer structure of the mixture of non-metallic phosphorus and silicon. The intermediate layer is deposited by PECVD. The ratio of a number of phosphorus atoms to a number of silicon atoms is 1-3:10, and the total thickness of the layer is 1-2 nm.

The upper transport layer is produced on the surface of the intermediate layer, and the $TiO_2$ thin film was deposited by ALD, the thickness of the thin film is 10-20 nm. The $TiO_2$ thin film may be used as the band buffer and the electron transport layer of the upper cell unit.

The upper cell unit is a thin film cell with a wide band gap absorption layer, and the hand gap is 1.5-2.3 eV. For example, perovskite solar cells have a band gap of 1.7 eV. The C60 coating is spin coated on the upper transport layer as the electron transport layer. Then perovskite materials are produced by a spin coating method. The thickness of the perovskite coating is 300-800 nm. The thickness should be considered for electrical and optical matching of the overall device, and then the hole transport layer is evaporated.

The overall bottom and top of the device are provided with metal electrodes to collect and export the carriers. The top of the device has a layer or multilayer antireflection film to reduce the overall optical loss of the device.

In the embodiment of the present disclosure, there are more defects in the intermediate layer of the tunnel junction. The intermediate layer having more defects has strong recombination capacity, limits the position of the carrier recombination in the intermediate layer of the tunnel junction to a larger extent. Compared with the intermediate layer, the upper transport layer and the lower transport layer has less defects and stronger carrier transport capacity. Therefore, the upper transport layer and the lower transport layer basically only plays a role in the carrier transport, and basically, the intermediate layer only plays a role in recombination. The recombination center is basically limited in the intermediate layer of the tunnel junction, which improves the overall recombination rate and conductivity of the tunnel junction, and reduces the overall series resistance.

The embodiment of the present disclosure also provides a method for producing the tandem photovoltaic device. The method includes:

Step 101, providing the lower cell unit, wherein the lower cell unit is a crystalline silicon cell;

Step 102, fabricating the tunnel junction according to any one of the embodiments of the present disclosure on a light facing surface of the lower cell unit;

Step 103, depositing the upper cell unit on a light facing surface of the tunnel junction, wherein a band gap of the upper cell unit is greater than a band gap of the lower cell unit.

Optionally, the step 102 may include the sub-steps as follows:

with the light facing surface of the lower cell unit being a substrate, doping to obtain the lower cell unit; or depositing on the light facing surface of the lower cell unit to form the lower transport layer; and etching and corroding on the light facing surface of the lower cell unit to obtain the ordered defect layer.

In the embodiment of the present disclosure, each step of the method may be referred to the relevant records in the previous embodiments and can achieve the same or similar beneficial effect. In order to avoid repetition, it is no longer repeated here.

It should be noted that, regarding the process embodiments, for brevity of the description, all of them are expressed as the combination of a series of actions, but a person skilled in the art should know that the embodiments of the present disclosure are not limited by the sequences of the actions that are described, because, according to the embodiments of the present disclosure, some of the steps may have other sequences or be performed simultaneously. Secondly, a person skilled in the art should also know that all of the embodiments described in the description are preferable embodiments, and not all of the actions that they involve are required by the embodiments of the present disclosure.

In the embodiments of the present disclosure, regarding the tandem photovoltaic device and the producing method thereof, all of the components may refer to each other.

The embodiments of the present disclosure are described above with reference to the drawings. However, the present disclosure is not limited to the above particular embodiments. The above particular embodiments are merely illustrative, rather than limitative. A person skilled in the art, under the motivation of the present disclosure, can make many variations without departing from the spirit of the present disclosure and the protection scope of the claims, and all of the variations fall within the protection scope of the present disclosure.

What is claimed is:

1. A tandem photovoltaic device, comprising: an upper cell unit, a lower cell unit and a tunnel junction located between the upper cell unit and the lower cell unit, and light transmits the upper cell unit onto the lower cell unit when the tandem photovoltaic device works; wherein the lower cell unit is a crystalline silicon cell;

the tunnel junction comprises an upper transport layer, a lower transport layer and an intermediate layer located between the upper transport layer and the lower transport layer, wherein the upper transport layer and the lower transport layer are in direct contact with the intermediate layer, respectively, the upper transport layer corresponds to a first conducting type, the lower transport layer corresponds to a second conducting type, and the first conducting type is different from the second conducting type;

a material of the lower transport layer is selected from one of crystalline silicon, amorphous silicon, nanocrystalline silicon, amorphous silicon carbide, nanocrystalline silicon carbide and crystalline silicon carbide, and the doping concentration of the lower transport layer is $10^{15}$ $cm^{-3}$-$10^{19}$ $cm^{-3}$, and the doping concentration of the lower transport layer increases progressively along a direction facing the intermediate layer; and the intermediate layer is an ordered defect layer, a space scale of defects of the ordered defect layer is 0.5 nm-2 nm, and an average center distance of the defects is 1 nm-100 nm; or the intermediate layer is a continuous thin layer, wherein when a material of the intermediate layer is a metal, a thickness of the intermediate layer is 0.5 nm-2 nm; and when a material of the intermediate layer is a semiconductor material, a doping concentration of the continuous thin layer is $10^{20}$ $cm^{-3}$-$10^{21}$ $cm^{-3}$; or the intermediate layer comprises a first layer contacted with the lower transport layer and a second layer contacted with the upper transport layer, wherein a conducting type of the first layer is same as a conducting type of the lower transport layer, a conducting type of the second layer is same as a conducting type of the upper transport layer, a doping concentration of the first layer is 10 times-10000 times of a doping concentration of the lower transport layer, and the doping concentration of the first layer is less than or equal to $10^{21}$ $cm^{-3}$; a doping concentration of the second layer is 10 times- 10000 times of a doping concentration of the upper transport layer, and the doping concentration of the second layer is less than or equal to $10^{21}$ cm$^{-3}$.

2. The tandem photovoltaic device according to claim 1, wherein the ordered defect layer is a lattice structure formed by quantum dots or a defect array formed by defect structures; and in case of the ordered defect layer being the lattice structure formed by the quantum dots, a spatial scale of the quantum dots is 0.5 nm-2 nm; an average center distance of the quantum dots is 1 nm-100 nm; a material of the quantum dots is selected from at least one of a metal with a work function greater than 3.5 eV, silicon, carbon, germanium and an III-V group compound; and in case of the ordered defect layer being the defect array formed by the defect structures, a spatial scale of the defect structures is 0.5 nm-2 nm, and an average center distance of the defect structures is 1 nm-100 nm.

3. The tandem photovoltaic device according to claim 1, wherein the intermediate layer is the continuous thin layer, and in case of the material of the intermediate layer being the metal, a material of the continuous thin layer is a metal with a work function greater than 3.5 eV; and in case of the material of the intermediate layer being the semiconductor material, the material of the continuous thin layer is selected from one of boron, nitrogen, phosphorus, a mixture of boron and silicon, a mixture of nitrogen and silicon, and a mixture of phosphorus and silicon.

4. The tandem photovoltaic device according to claim 1, wherein a thickness of the lower transport layer is 2 nm-20 nm; and the intermediate layer comprises the first layer contacted with the lower transport layer and the second layer contacted with the upper transport layer, a material of the first layer and a material of the second layer are selected from one of the crystalline silicon, the amorphous silicon, the nanocrystalline silicon, the amorphous silicon carbide and the crystalline silicon carbide, and both of the doping concentration of the first layer and the doping concentration of the second layer are $10^{16}$ cm$^{-3}$-$10^{20}$ cm$^{-3}$.

5. The tandem photovoltaic device according to claim 1, wherein a thickness of the upper transport layer is 2 nm-20 nm; and a material of the upper transport layer is selected from one of crystalline silicon, amorphous silicon, nanocrystalline silicon, amorphous silicon carbide, nanocrystalline silicon carbide and crystalline silicon carbide, and the doping concentration of the upper transport layer is $10^{15}$ cm$^{-3}$-$10^{19}$ cm$^{-3}$; or the material of the upper transport layer is selected from one of a metal oxide, a metal selenide and a metal sulfide; or the material of the upper transport layer is selected from multi-compounds formed by doping with metal or nonmetal in the metal oxide, the metal selenide or the metal sulfide; or the material of the upper transport layer is selected from at least one of an III-V group compounds, a CIS homologues material and an intrinsic conducting polymer.

6. The tandem photovoltaic device according to claim 5, wherein in case of the material of the upper transport layer being the metal oxide, the metal oxide is selected from one of zinc oxide, tin oxide, titanium oxide, molybdenum oxide, copper oxide, nickel oxide, vanadium oxide, tantalum oxide, hafnium oxide, niobium oxide, tungsten oxide, indium oxide and gallium oxide;

in case of the material of the upper transport layer being the multi-compound, the multi-compound is selected from one of tin oxide doped with indium, tin oxide doped with fluorine, zinc oxide doped with gallium, zinc oxide doped with indium gallium;

in case of the material of the upper transport layer being the CIS homologues material, the CIS homologues material is selected from one of copper indium selenium, copper gallium sulfur, copper indium gallium selenium sulfur, copper aluminum gallium sulfur and copper zinc tin sulfur; and in case of the material of the upper transport layer being the intrinsic conducting polymer, the intrinsic conducting polymer is selected from one of polyacetylene, polythiophene, polypyrrole, polyaniline, polyphenylene, polyphenylenevinylene and polydiacetylene.

7. The tandem photovoltaic device according to claim 5, wherein when the material of the upper transport layer is selected from one of crystalline silicon, amorphous silicon, nanocrystalline silicon, amorphous silicon carbide, nanocrystalline silicon carbide and crystalline silicon carbide, the doping concentration of the lower transport layer increases progressively along a direction facing the intermediate layer.

8. The tandem photovoltaic device according to claim 1, wherein a thickness of the intermediate layer is 0.5 nm-2 nm, and a thickness of the tunnel junction is 4.5 nm-50 nm.

9. The tandem photovoltaic device according to claim 1, wherein when a material of a light facing surface of the lower cell unit is crystalline silicon, the material of the lower transport layer is selected from crystalline silicon or crystalline silicon carbide; and the light facing surface of the lower cell unit is a surface on which the lower cell unit contacts with the lower transport layer; and when the material of the light facing surface of the lower cell unit is amorphous silicon, the material of the lower transport layer is selected from one of amorphous silicon, nanocrystalline silicon, amorphous silicon carbide and nanocrystalline silicon carbide.

10. The tandem photovoltaic device according to claim 1, wherein a light facing surface of the lower cell unit is provided with a light trapping structure, and the light facing surface of the lower cell unit is a surface on which the lower cell unit contacts with the lower transport layer;

a shadow surface of the tunnel junction is matched with the light facing surface of the lower cell unit in shape; and the shadow surface of the tunnel junction is a surface on which the tunnel junction contacts with the light facing surface of the lower cell unit.

11. The tandem photovoltaic device according to claim 4, wherein a thickness of the upper transport layer is 2 nm-20 nm; and a material of the upper transport layer is selected from one of crystalline silicon, amorphous silicon, nanocrystalline silicon, amorphous silicon carbide, nanocrystalline silicon carbide and crystalline silicon carbide, and the doping concentration of the upper transport layer is $10^{15}$ cm$^{-3}$-$10^{19}$ cm$^{-3}$; or the material of the upper transport layer is selected from one of a metal oxide, a metal selenide and a metal sulfide; or the material of the upper transport layer is selected from multi-compounds formed by doping with metal or nonmetal in the metal oxide, the metal selenide or the metal sulfide; or the material of the upper transport layer is selected from at least one of an III-V group compounds, a CIS homologues material and an intrinsic conducting polymer.

\* \* \* \* \*